United States Patent
Konkle et al.

(10) Patent No.: US 7,800,065 B2
(45) Date of Patent: Sep. 21, 2010

(54) METHODS AND APPARATUS FOR CONDUCTING HEAT FROM AN ELECTRONIC ASSEMBLY WHILE PROVIDING SHOCK PROTECTION

(75) Inventors: Nicholas Ryan Konkle, Waukesha, WI (US); Gary McBroom, Dousman, WI (US)

(73) Assignee: General Electric Company, Schenectady, NY (US)

( * ) Notice: Subject to any disclaimer, the term of this patent is extended or adjusted under 35 U.S.C. 154(b) by 169 days.

(21) Appl. No.: 12/167,129

(22) Filed: Jul. 2, 2008

(65) Prior Publication Data

US 2010/0001195 A1 Jan. 7, 2010

(51) Int. Cl.
*G01J 1/00* (2006.01)
(52) U.S. Cl. .................................. 250/336.1
(58) Field of Classification Search .................
250/370.01–370.15, 336.1; 378/98.8, 189
See application file for complete search history.

(56) References Cited

U.S. PATENT DOCUMENTS

| | | | |
|---|---|---|---|
| 5,804,832 A | 9/1998 | Crowell et al. | |
| 6,025,598 A | 2/2000 | Tago | |
| 6,548,177 B2 | 4/2003 | Hieda et al. | |
| 6,700,126 B2 | 3/2004 | Watanabe | |
| 6,825,472 B2 | 11/2004 | Endo | |
| 6,897,449 B1 | 5/2005 | Hata | |
| 7,057,181 B2 * | 6/2006 | Yagi | 250/370.09 |
| 2005/0017188 A1 * | 1/2005 | Yagi | 250/370.09 |
| 2005/0285045 A1 | 12/2005 | Baumgartner et al. | |
| 2007/0272873 A1 * | 11/2007 | Jadrich et al. | 250/370.11 |

* cited by examiner

*Primary Examiner*—David P Porta
*Assistant Examiner*—Kiho Kim
(74) *Attorney, Agent, or Firm*—Dean D. Small; Small Patent Law Group

(57) ABSTRACT

An apparatus is provided that includes an electronic assembly having a panel and a circuit board, a casing surrounding the electronic assembly and at least one isolated member coupled to the casing. The apparatus further includes a shock absorbing material flexibly coupling the electronic assembly directly or indirectly to the at least one isolated member.

26 Claims, 9 Drawing Sheets

METHODS AND APPARATUS FOR CONDUCTING HEAT FROM AN ELECTRONIC ASSEMBLY WHILE PROVIDING SHOCK PROTECTION

BACKGROUND OF THE INVENTION

This invention relates generally to methods and apparatus for providing shock protection to breakable electronic assemblies in a casing, while, at the same time, conducting heat away from heat generating components of the electronic assembly. Methods and apparatus of the present invention are particularly useful in the field of medical imaging, but can be applied to other fields as well.

In various portable medical imaging applications, an air-cooled x-ray detector array is sealed in a casing that is typically formed of metal. The x-ray detector array includes a scintillator array on a breakable glass panel. The glass panel is affixed directly or indirectly to a circuit board that includes heat generating components. The heat generating components are thermally coupled to the casing via a thermal compound that is not shear resistant, meaning that the thermal coupling could be broken when shear forces are applied.

The x-ray detector array and an x-ray source are positioned on opposite sides of a patient to collect medical images of the patient. In most uses, data is collected once or infrequently from the detector array. Thus, heat generated by the heat generating components usually remains nominal. However, other uses of large x-ray detector arrays, e.g., uses that provide a more constant data stream (such as for full-motion and/or contrast agent imaging) are emerging. These uses generate a rather considerable amount of heat that must be conducted away.

In order to simultaneously isolate the x-ray detector array from mechanical shock loading and thermally manage component and detector array temperatures, it would be desirable to allow the detector array to move relative to the casing to some extent while absorbing the shock load to reduce maximum acceleration delivered to the detector array. In addition, it would be desirable to interface the heat generating electrical components to the casing using a thermal compound. In addition, it would be desirable to provide a lighter detector than is now available. However, the thermal compound will be in shear when the detector array is dropped, accidently or otherwise. The thermal compound will not be able to endure the expected large deflections. Also, when the detector array is dropped, a shock is delivered to the casing. To isolate the glass panel from shock and breakage, internal movement of the glass panel relative to the covers is desirable.

BRIEF DESCRIPTION OF THE INVENTION

Therefore, in one aspect, some embodiments of the present invention provide an apparatus that includes an electronic assembly having a panel and a circuit board, a casing surrounding the electronic assembly and at least one isolated member coupled to the casing. The apparatus further includes a shock absorbing material flexibly coupling the electronic assembly directly or indirectly to the at least one isolated member.

In another aspect, some embodiments of the present invention provide an x-ray imaging component that include an electronic assembly having a circuit board and an x-ray imaging panel, a casing surrounding the electronic assembly and at least one isolated member flexibly coupled to the casing. The x-ray imaging component further includes a heat conducting material coupled between the circuit board and the at least one isolated member configured to conduct heat away from the circuit board to the at least one isolated member. The x-ray imaging component also includes a shock absorbing material coupling the electronic assembly to the casing.

In yet another aspect, some embodiments of the present invention provide a method for mechanically isolating an electrical assembly from shock and for providing heat conduction out of the electrical assembly. The method includes thermally coupling heat from heat generating components mounted on the electrical assembly to a back cover of a casing using a thermal interface material. An x direction and a y direction are defined essentially parallel to a cover front of the casing and perpendicular to each other, and a z direction is defined essentially perpendicular to the cover front and both the x direction and the y direction. The method further includes mechanically coupling the back cover to a cover wall of the casing using a shock absorbing material configured to absorb shock in at least both the x direction and the y direction.

In still another aspect, some embodiments of the present invention provide a radiographic apparatus that includes an external casing and at least one isolated member flexibly coupled to the external casing. The radiographic apparatus further includes an external imaging panel assembly attached to the at least one isolated member.

In another aspect, some embodiments of the present invention provide a radiographic apparatus that includes an external casing and an internal panel assembly flexibly attached to the external casing. The radiographic apparatus further includes at least one conductive flexible member positioned between one side of the internal panel assembly and an internal surface of the external casing.

DETAILED DESCRIPTION OF THE INVENTION

Figure 1:
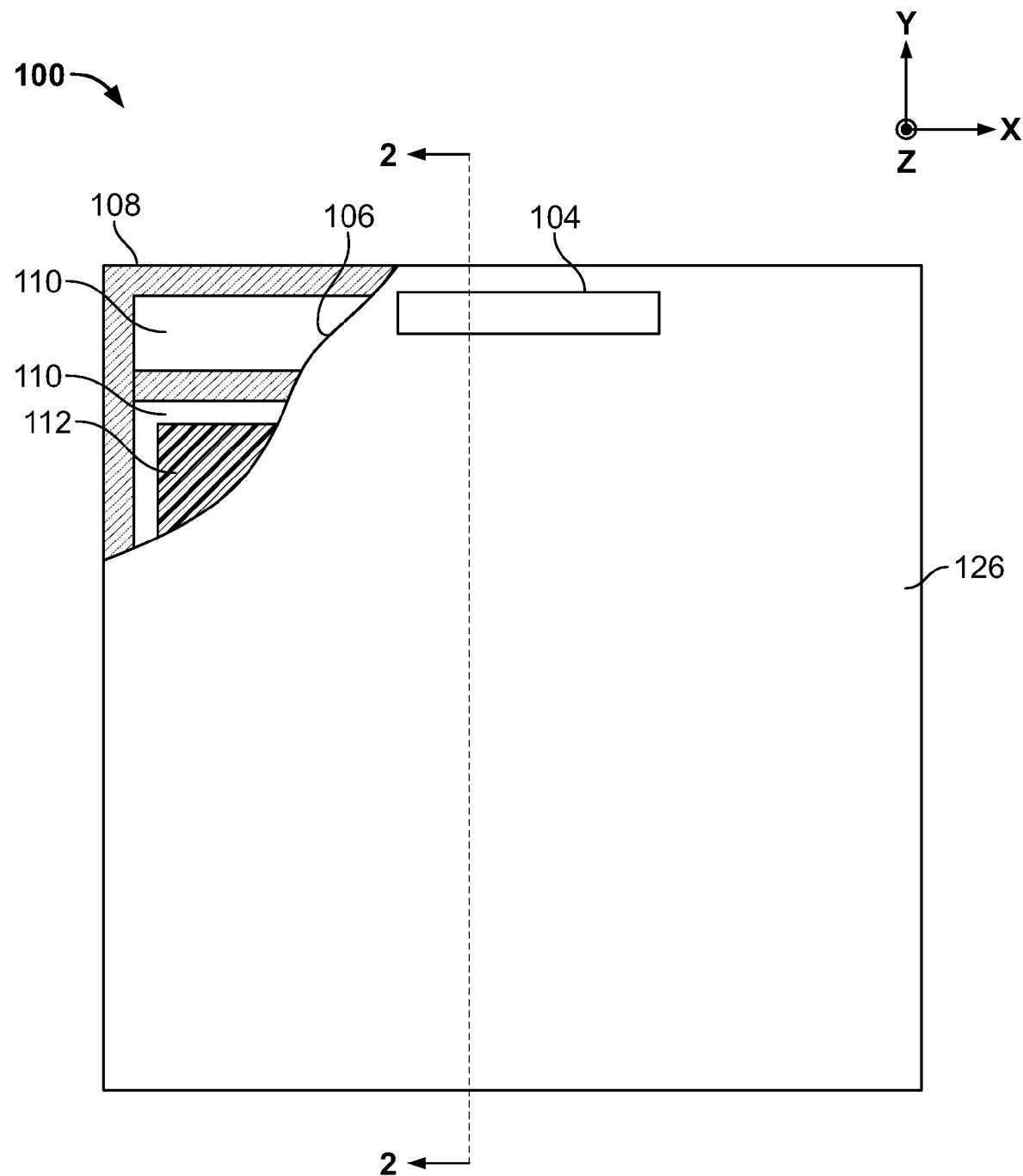
FIG. 1 is bottom cut-away view of an enclosed x-ray detector array.

The foregoing summary, as well as the following detailed description of certain embodiments of the present invention, will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (e.g., processors or memories) may be implemented in a single piece of hardware (e.g., a general purpose signal processor or a block of random access memory, hard disk, or the like). Similarly, the programs may be stand alone programs, may be incorporated as subroutines in an operating system, may be functions in an installed software package, and the like. It should be understood that the various embodiments are not limited to the arrangements and instrumentality shown in the drawings.

As used herein, an element or step recited in the singular and proceeded with the word "a" or "an" should be understood as not excluding plural said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Figure 2:
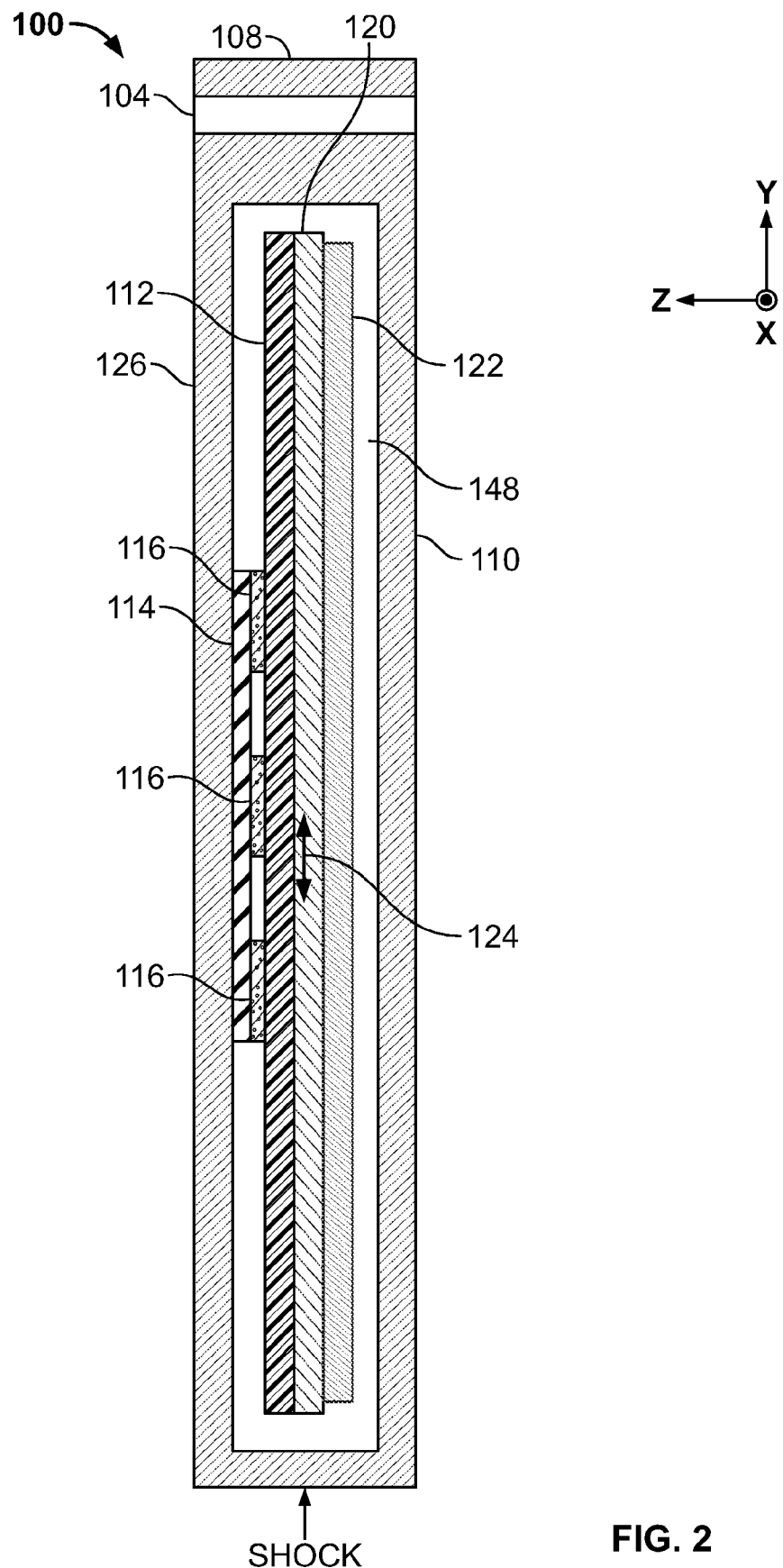
FIG. 2 is a side cut-away view of the enclosed x-ray detector shown in FIG. 1 viewed along the line 2-2.

To become familiar with the problems associated with providing heat conduction out of an electronic apparatus as well as shock absorption in more than one direction, reference is now made to FIG. 1 and FIG. 2. The apparatus shown in FIG. 1 is a bottom cut-away view of an enclosed x-ray detector array 100. The apparatus comprises a back cover 126, shown as a surface parallel to the plane of the illustration. Back cover 126 has a carrying slot 104 that can be used to carry and/or store x-ray detector array 100. A corner of back cover 126 is cut away in the illustration as indicated by cutaway line 106. Behind this corner (i.e., above back cover 126) are cover wall 108, cover front 110, and a circuit board 112. Back cover 126, cover wall 108, and cover front 110 together comprise a "casing," and may be made of a lightweight, low atomic number (N) material, such as aluminum or more advantageously, graphite material. Graphite is advantageous because is it lower weight than aluminum, but it is also stiffer and less energy-absorbent.

FIG. 2 is a side cut-away view of the enclosed x-ray detector array 100 of FIG. 1 viewed along the line 2-2. An example of a shock force applied to the x-ray detector array is shown along with an arrow 124 that indicates the direction of motion of internal components as a result of the application of this shock. Circuit board 112 is affixed (for example, using an adhesive) to panel support 120 (that is also made of a low N material), which in turn is affixed to panel 122. Panel 122 may be a glass panel and may itself include x-ray scintillator material. In some embodiments, a panel support 120 is not used, and circuit board 112 is affixed directly to panel 122. Together, circuit board 112 and panel 122 (and panel support 120, if present) comprise an "electronic assembly." To provide some degree of break resistance for panel 122, a gap 148 is provided between panel 122 and cover front 110. Also, electronic assembly is clear of any wall of the casing, but is mounted to back cover 126. Additionally, heat generating components 116 on circuit board 112 are thermally coupled to back cover 126 using a heat conducting compound 114. Heat conducting compound 114 provides, directly or indirectly, a mechanical coupling between circuit board 112 and back cover 126.

The heat conducting compound is needed in some applications of x-ray detector array 100 that provide high-speed readout of pixilated images from detector array 100 and thus generate constant heat that has to be removed. Furthermore, X-ray detector array 100 is portable, but typically large enough to image a significant region of a human patient, such as the patient's chest. Thus, X-ray detector array 100 may be only about one or a few centimeters high, but may be tens of centimeters in width and length. In portable use, shocks may be accidently applied from almost any direction, and x-ray detector array 100 may be tipped over while in use or even stepped upon. If the electronic assembly comprising circuit board 112 and panel 122 moves relative to back cover 126 (e.g., about 3 mm), heat conducting compound 114 will be subject to severe shear loading and will likely fail and become ineffective.

Figure 3:
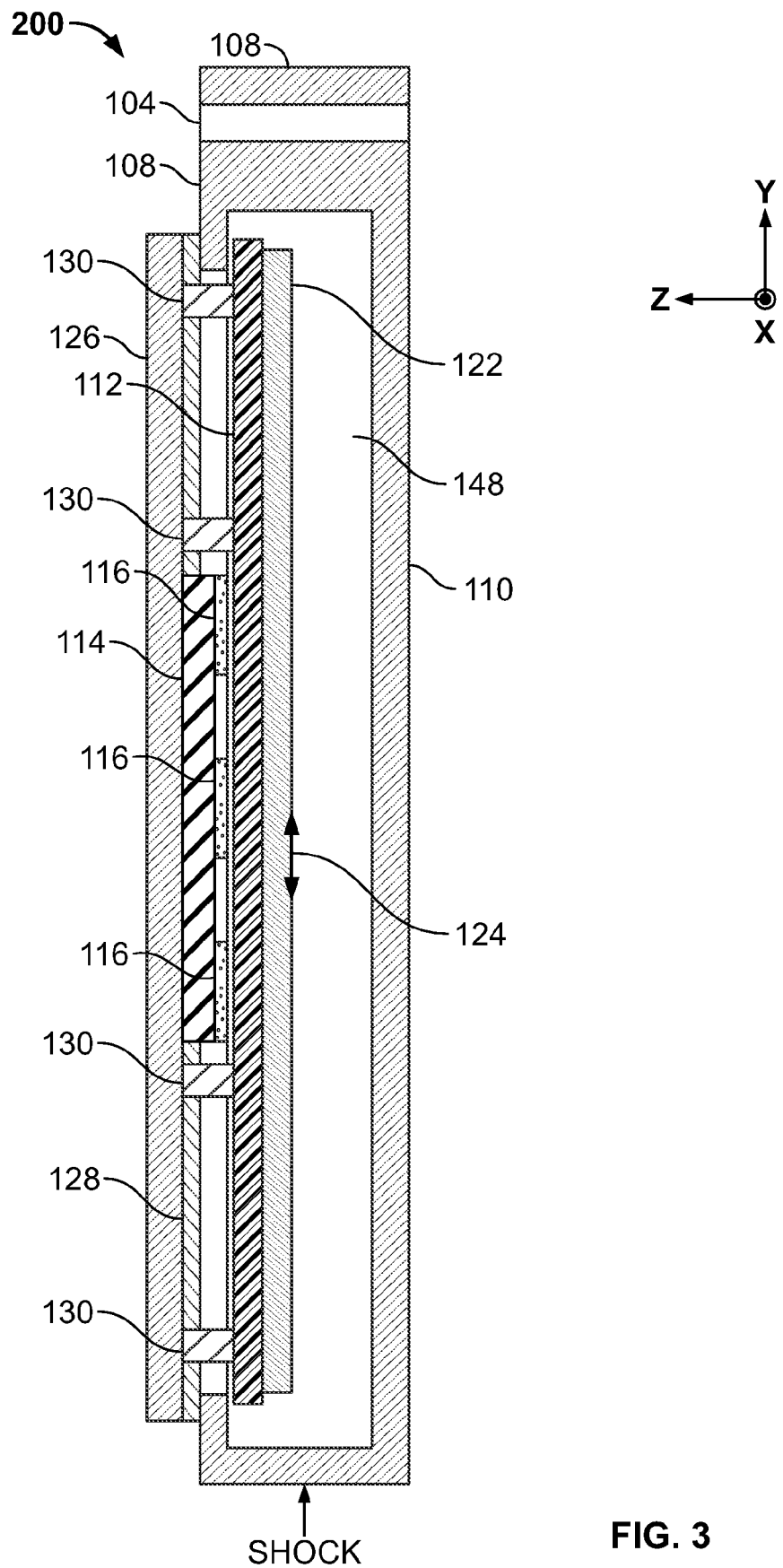
FIG. 3 is a side cut-away view of an apparatus embodiment of the present invention.

To avoid this failure, and as exemplified in FIG. 3 (which is taken along 2-2 line in FIG. 1, but through a different embodiment that appears similar in the view of FIG. 1), some apparatus embodiments 200 of the present invention have an electronic assembly that includes a circuit board 112, a panel 122, and at least one heat generating component 116. Panel 122 is mechanically attached directly or indirectly to circuit board 112 and to a casing surrounding the electronic assembly. The casing includes cover walls 108, a cover front 110, and a back cover 126. Panel 122 forms a front-facing surface of the electronic assembly that is separated from the cover front 110 by gap 148. The apparatus further includes electrically nonconductive heat conducting compound 114 that is configured to conduct heat away from the heat generating component(s) 116. For example, heat conducting compound 114 is thermally coupled to the heat generating component(s) 116 and back cover 126. Also included in the apparatus is a shock absorbing material 128 coupling the electronic assembly directly or indirectly to the casing or to a portion thereof (or to any isolated member). Shock absorbing material 128 is further configured to prevent shearing of the electronically nonconductive heat conducting compound 114. For example, shock absorbing material 128 prevents shearing by forming a gasket between the casing and back cover 126 in a plane essentially parallel to the plane of circuit board 112. A suitable adhesive (not shown in the Figures) may be used to adhere shock absorbing material 128 to the casing and the back cover. A plurality of rigid mounts 130 are provided between circuit board 112 and back cover 126 in some embodiments. Rigid mounts 130 may also be secured in place with a suitable adhesive, as may other components of the apparatus where it is necessary or desirable to do so. In many embodiments, the choice between an adhesive or some other type of securing means, such as a screw, eyelet, or bolt, can be left as a design choice to one of ordinary skill in the art.

Embodiments 200 reduce the transmission of shearing forces to heat conducting compound 114 as well as efficiently conduct heat away from heat generating component(s) 116 (such as resistors and semiconductors) to back cover 126. In one variation of the embodiment of FIG. 3, panel support 120 is not used, and panel 122 is directly affixed to circuit board 112. This varied embodiment has an additional advantage of reducing the weight and thickness of the apparatus.

In some embodiments, back cover 126 is rigidly mounted via rigid mounts 130 to circuit board 112 and the shock absorbing material 128 is sandwiched between the back cover 126 and cover wall 108.

In yet other embodiments, and as shown in FIG. 3, a panel support 120 is affixed between panel 122 and circuit board 112. In some of these embodiments, panel 122 comprises a pixilated x-ray detector and the apparatus is an x-ray imaging component. In some embodiments of the x-ray imaging component, the casing consists essentially of graphite material, which is lighter than but stiffer than common metals such as aluminum. Also, in some embodiments of the present invention, the pixilated x-ray detector comprises a scintillator array.

A set of axes x, y, and z may be defined by the apparatus to aid in illustrating directions of shock induced vibration and shearing. An x direction and a y direction can be defined so that both the x direction and the y direction are essentially parallel to the cover front and perpendicular to each other. A z direction may then be defined that is essentially perpendicular to the cover front and to both the x direction and the y direction.

Figure 4:
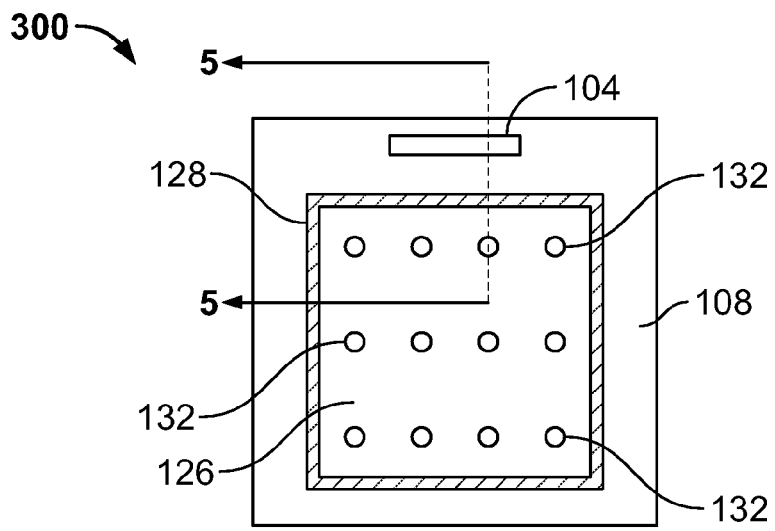
FIG. 4 is a bottom view of another apparatus embodiment of the present invention.
Figure 5:
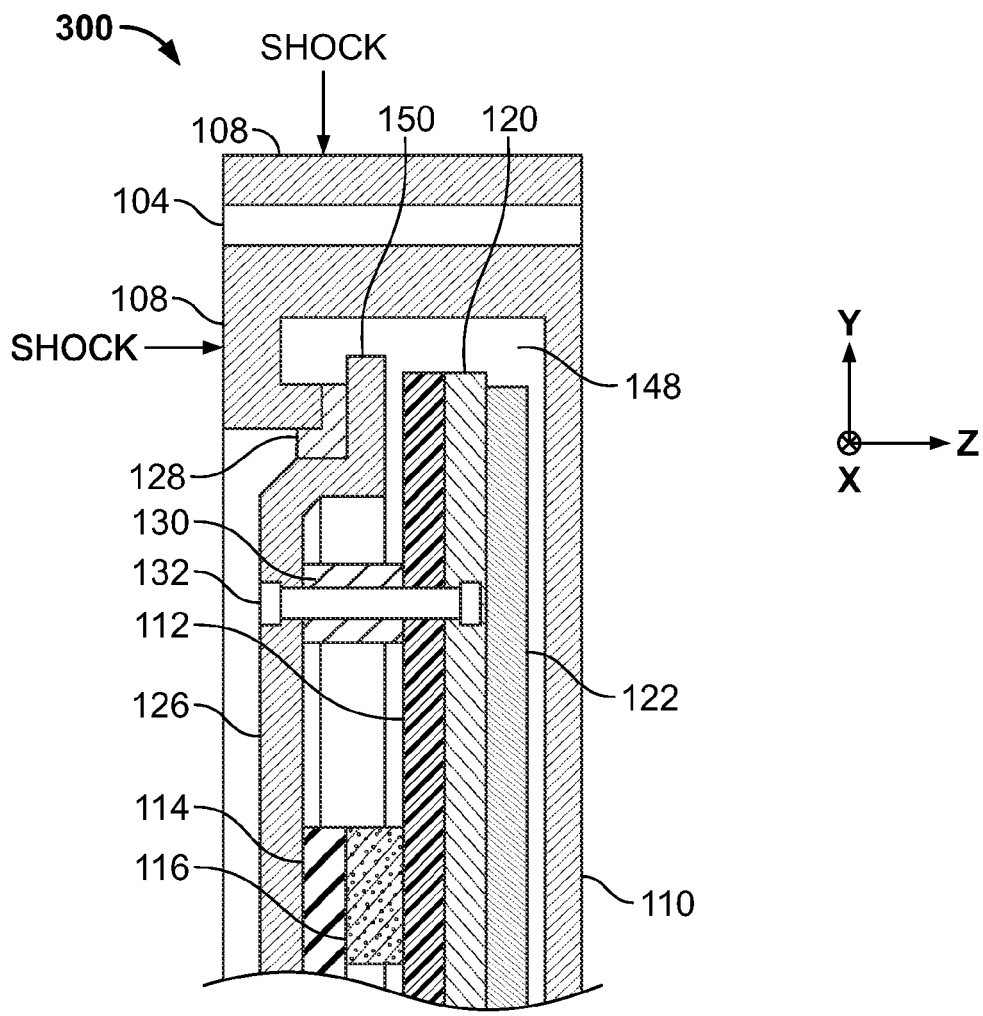
FIG. 5 is a side cut-away partial view of the apparatus embodiment of FIG. 4 viewed along line 5-5 of FIG. 4.

In still other embodiments 300 of the present invention, and as shown in FIG. 4 and FIG. 5 (where FIG. 5 is viewed along section line 5-5), back cover 126 is rigidly mounted to the electronic assembly. The rigid mounting uses, for example, fasteners 132 and/or rigid mounts 130. A cantilevered portion 150 of back cover 126 sealingly engages cover wall 108 with a shear shock absorbing material 128 therebetween. Shock absorbing material 128 is configured to absorb shock in both x and y directions. For example, an L-shaped ring of shock absorbing material 128 is confined at or near the entire perimeter of back cover 126. This embodiment also absorbs shock in the z direction, and advantageously, the shock absorption can be tuned separately in different directions by changing the thickness of shock absorbing material 128 in these different directions. In addition, by recessing back cover 126, shock is further isolated from heat conducting compound 114 and also panel 122 and circuit board 112 in the event the assembly is tipped over.

Figure 6:
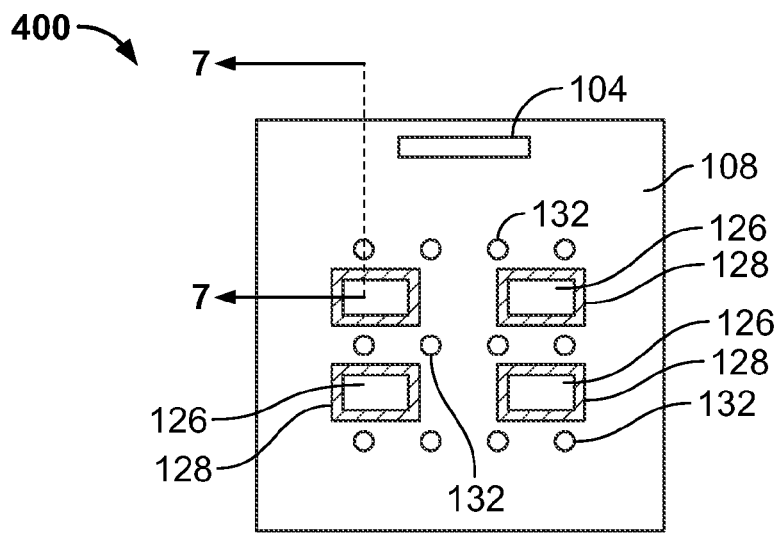
FIG. 6 is a bottom view of yet another apparatus embodiment of the present invention.
Figure 7:
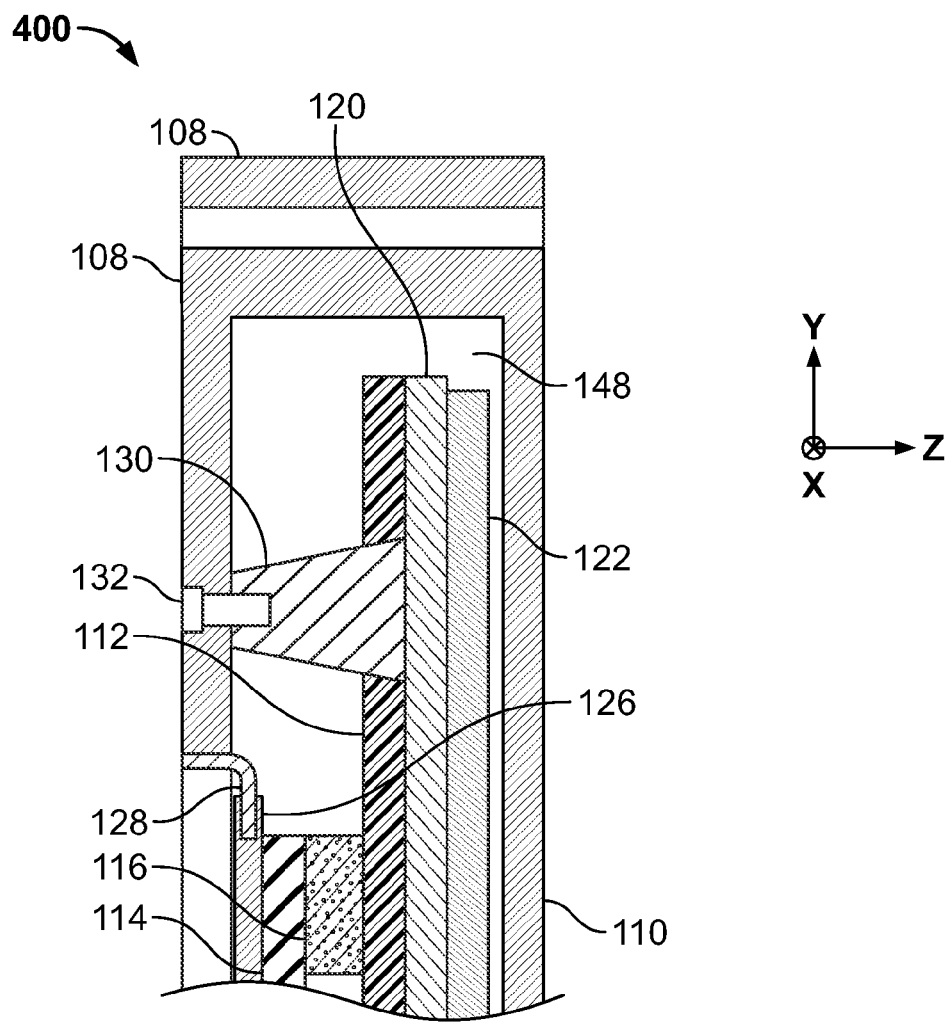
FIG. 7 is a side cut-away partial view of the apparatus embodiment of FIG. 6 viewed along line 7-7 of FIG. 6.

As shown in FIG. 6 and FIG. 7 (where FIG. 7 is viewed along section line 7-7 of FIG. 6), other embodiments 400 of the present invention have more than one heat generating component 116 and a plurality of isolated back cover plates 126 each located under a heat generating component 116. Heat conducting compound 114 thermally conducts heat from each heat generating component 116 to its respective isolated back cover plate 126. Flexible material 128 in these embodiments forms an L-shaped seam. The seam surrounds back covers 126 and flexibly and resiliently mounts back covers 126 to cover wall 108. In some of these embodiments, the electronic assembly is shock—mounted to cover wall 108. An alternative fastener 132 and shock—mount 130 are illustrated in FIG. 6 and FIG. 7 to illustrate some of the numerous ways of flexibly mounting one portion of the assembly to another across a gap. Isolated back cover plates 126 in embodiments represented by FIG. 6 and FIG. 7 can advantageously be made of a substance having higher heat conductivity than graphite without substantially increasing the weight of the apparatus. Also, three dimensional shock absorption is provided by shock absorbing material 128 in these embodiments. Shock absorbing material 128 can be both electrically and thermally conductive to spread heat while retaining electrical shielding continuity.

Figure 8:
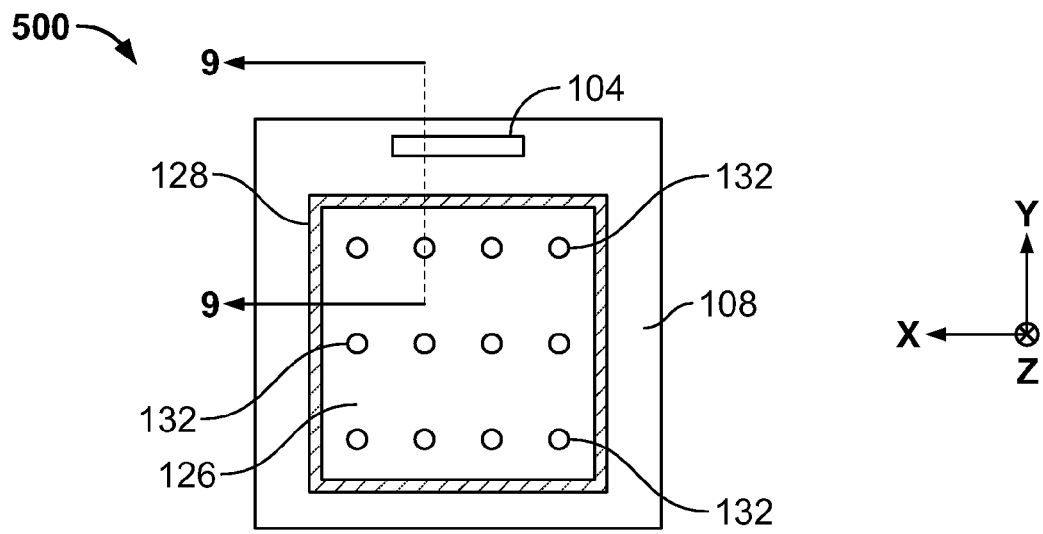
FIG. 8 is a bottom view of still another apparatus embodiment of the present invention.
Figure 9:
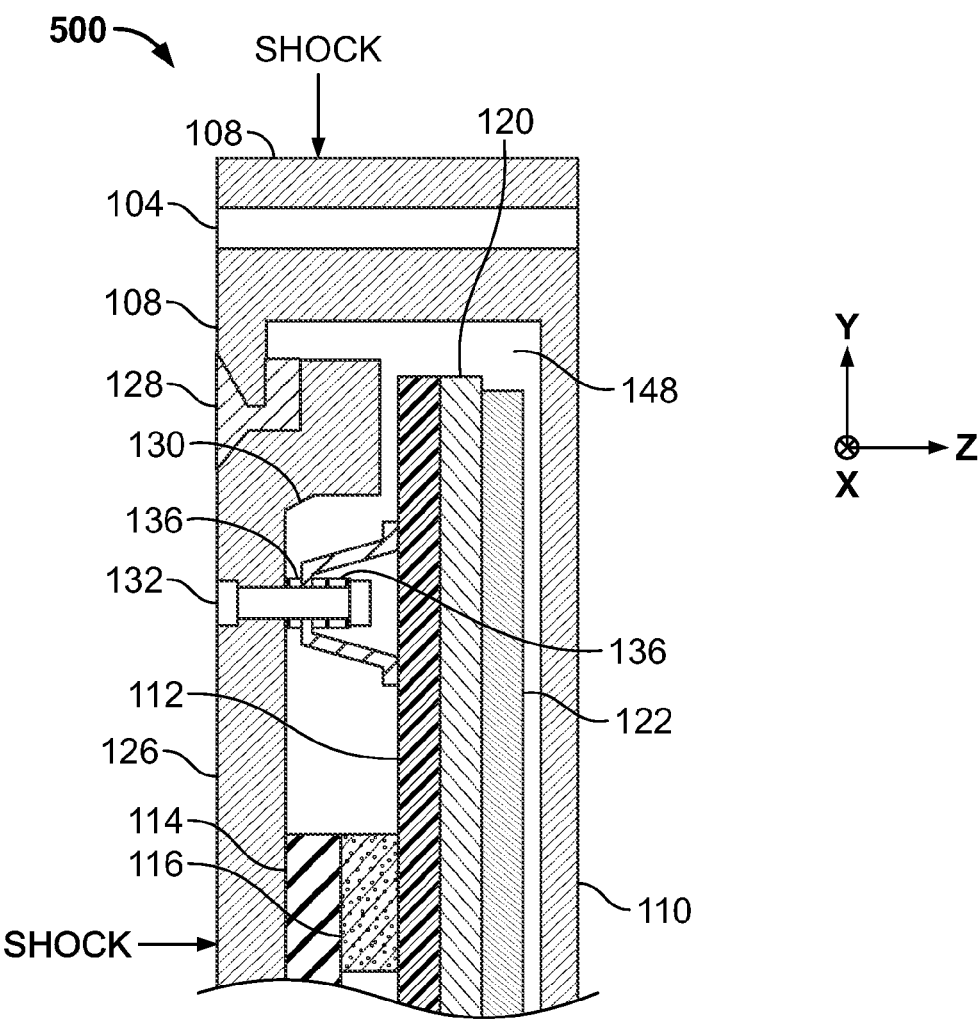
FIG. 9 is a side cut-away partial view of the apparatus embodiment of FIG. 8 viewed along line 9-9 of FIG. 8.

As illustrated in FIG. 8 and FIG. 9 (where FIG. 9 is a view from section line 9-9 of FIG. 8), some embodiments 500 of the present invention provide a layer of shear shock absorbing material adhered around an edge of back cover 126 to the electronic assembly in the x and y directions. In addition, z direction isolation is achieved via a one dimensional shock mount. More particularly, in these embodiments, back cover 126 is flush with a portion of cover wall 108 and shock absorbing material 128 comprises a shear shock absorbing material mechanically coupled between cover wall 108 and a cantilevered portion 150 of back cover 126 to provide shock absorption in both the x direction and the y direction. A one dimensional shock mount mechanically couples back cover 126 to circuit board 112 to provide shock absorption in the z-direction. A variation of a one dimensional shock mount is illustrated in FIG. 9. This one dimensional shock mount comprises a rigid mount 130 (for example, a bell-shaped mount as shown here), a fastener 132, and a pair of compressive shock absorber rings 136. These embodiments advantageously provide a flush back cover that is easy to assemble and shock absorption that can be tuned separately in each of the different directions.

Figure 10:
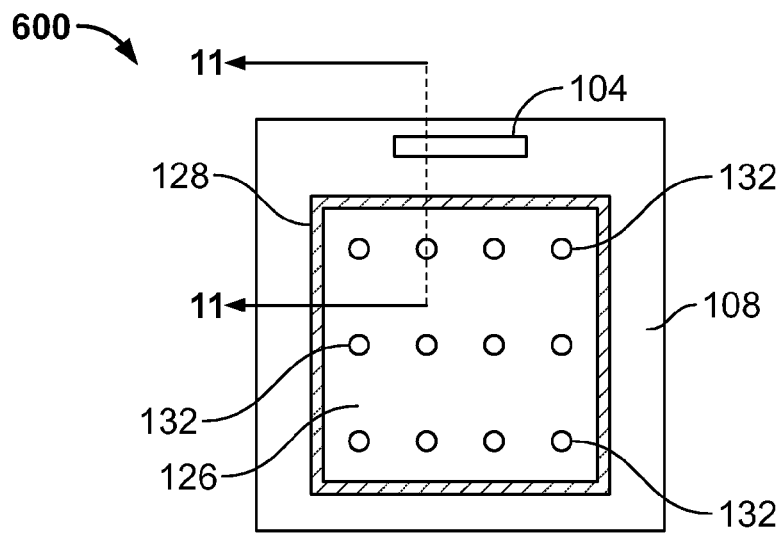
FIG. 10 is a bottom view of another apparatus embodiment of the present invention.
Figure 11:
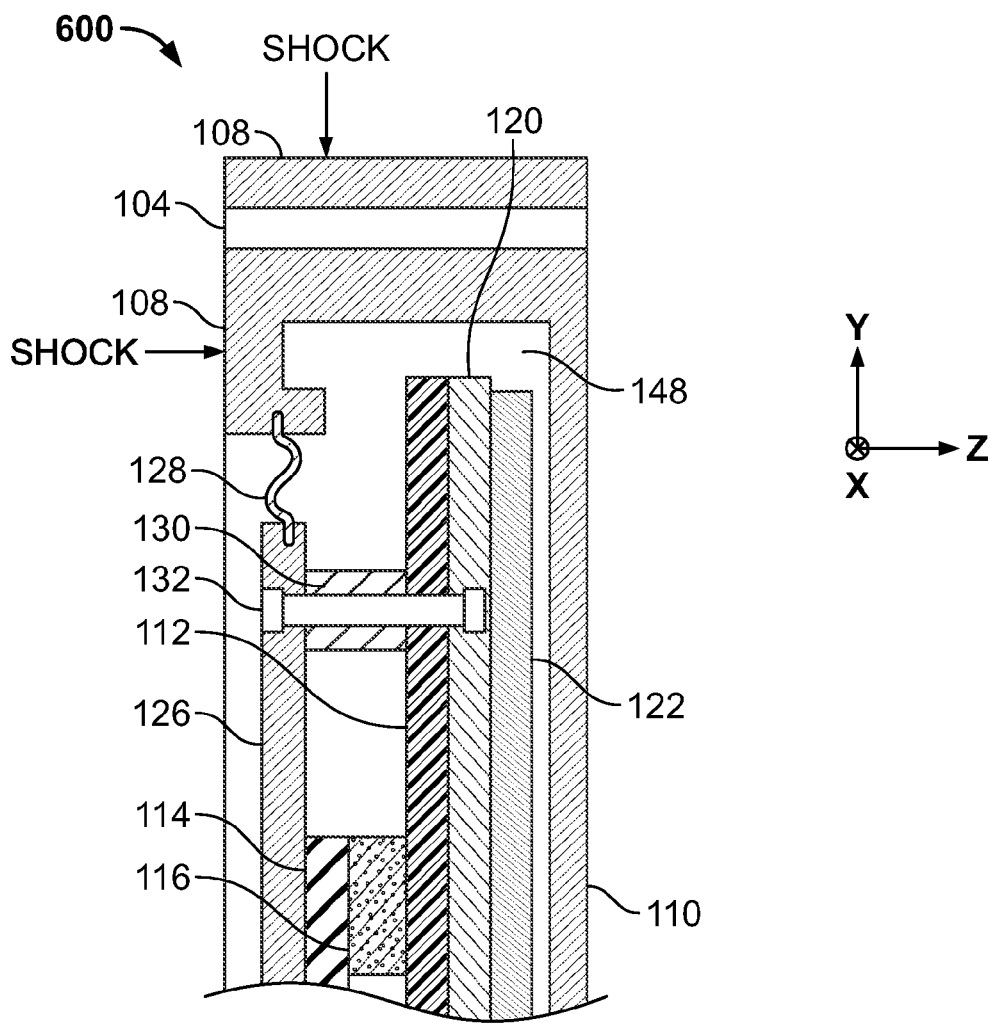
FIG. 11 is a side cut-away partial view of the apparatus embodiment of FIG. 10 viewed along line 11-11 of FIG. 10.

In some embodiments 600 of the present invention, and as shown in FIG. 10 and FIG. 11 (where FIG. 11 is a view from section line 11-11 of FIG. 10), shock absorbing material 128 comprises a seam mechanically coupled to cover wall 108 and back cover 126. The shock absorbing material seam is configured to provide shock absorption in all of the x direction, the y direction, and the z direction. For example, an S-shaped seam of shock absorbing material 128 rigidly attached (e.g., adhered) at its ends to cover wall 108 and back cover 126 can be used. Additionally, a rigid coupling (for example, a rigid mount 130 and a fastener 132) is provided to the electronic assembly and back cover 126. This embodiment and other similar embodiments provide isolation of back cover 126 in all directions. Advantageously, shock absorption can be tuned separately in different directions by changing only the shock absorbing material seam. For example, the thickness, composition, shape, and resiliency of shock absorbing material 128 can be changed for tuning purposes.

Figure 12:
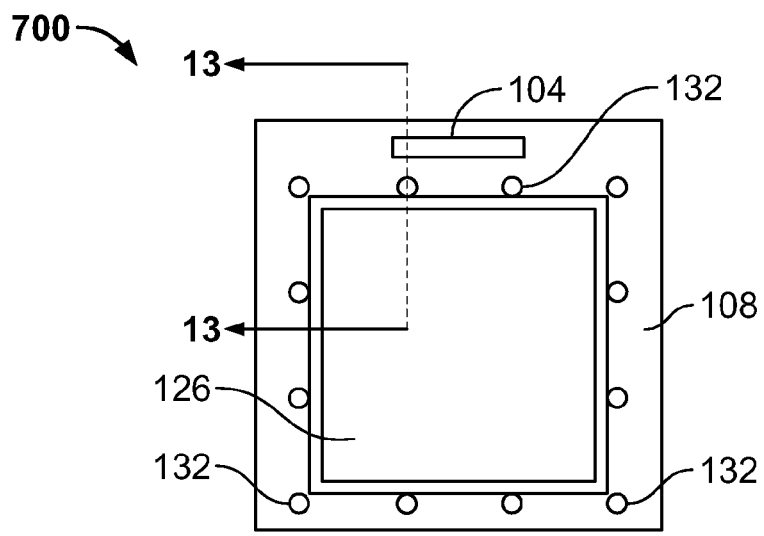
FIG. 12 is a bottom view of still another apparatus embodiment of the present invention.
Figure 13:
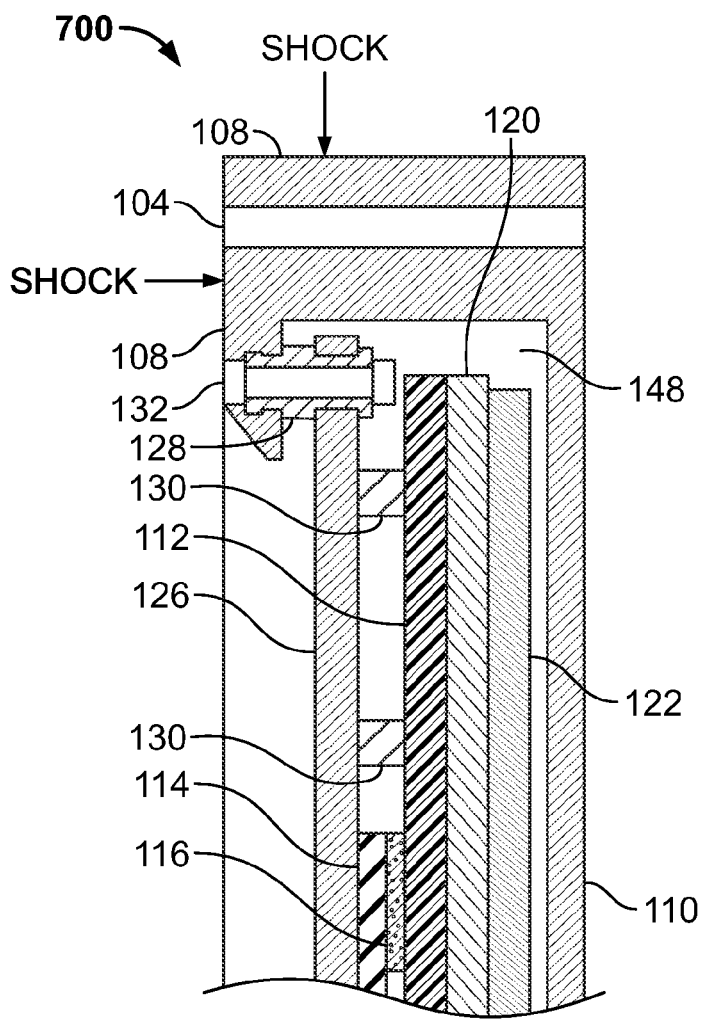
FIG. 13 is a side cut-away partial view of the apparatus embodiment of FIG. 12 viewed along line 13-13 of FIG. 12.

In yet other embodiments 700 of the present invention and as illustrated in FIG. 12 and 13 (where FIG. 13 is a view from line 13-13 of FIG. 12), back cover 126 is recessed within the casing, and shock absorbing material 128 sealingly engages a perimeter of back cover 126 between back cover 126 and cover wall 108. Fasteners 132 pass through cover wall 108, shock absorbing material 128, and back cover 126, providing shock isolation in x, y, and z directions. Rigid mounts 130 are provided in some embodiments to mechanically couple the electronic assembly to back cover 126.

Figure 14:
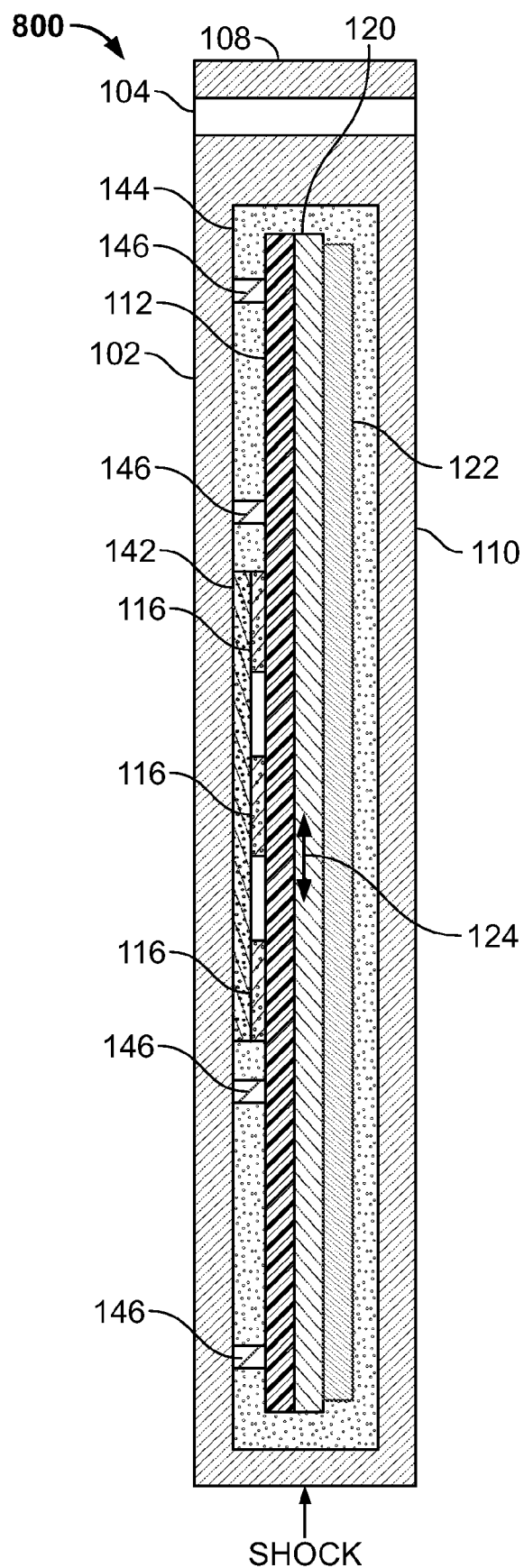
FIG. 14 is a side cut-away view of yet another apparatus embodiment of the present invention.

In still other embodiments 800 of the present invention and as illustrated in FIG. 14 (which also corresponds to section line 2-2 of FIG. 1, but taken through a different embodiment that appears similar in the view of FIG. 1), heat conducting compound and said shock absorbing material are one and the same, and are provided as heat conductive foam 142. Suitable materials for this foam for some applications include, but are not necessarily limited to, Dow CORNING TP-2160 and KERATHERM SOFTTHERM 86/200. Movement of the electronic assembly is taken up by heat conductive foam 142, allowing back cover 126 to remain fixed. These embodiments provide extra simplicity in the shock mounting scheme. In some embodiments, flexible mounts 146 are also provided that directly or indirectly mechanically couple circuit board 112 to back cover 126.

In yet other embodiments, at least gap 148 between panel 122 and cover front 110 contains a flexible material 144 that is configured to absorb crushing forces applied to front cover 110 to avoid damage to panel 122 when excessive crushing forces are applied to cover front 110. For example, a shock absorbent foam or resin may be used as flexible material 144 to spread or absorb forces that are applied along the z direction to cover front 110 that might otherwise pierce cover front 110 or bend cover front 110 into contact with glass panel 122 and shatter or crack panel 122. These embodiments provide the apparatus with some degree of breakage resistance.

In many cases, features from two or more of the above embodiments may be combined into new embodiments in manners not explicitly described above. For example, in some embodiments of the present invention, the apparatus is an x-ray imaging component that includes an electronic assembly including a circuit board 112, a panel 122 on which is a scintillator array, and at least one heat generating component 116 on circuit board 112. Panel 122 is mechanically attached directly or indirectly to circuit board 112. Also included is a casing consisting essentially of graphite surrounding the electronic assembly. The casing includes cover walls 108, a cover front 110, and a back cover 126. Panel 122 forms a front-facing surface of the electronic assembly that is separated from cover front 110 by gap 148 or compliant material. Further included is an electrically nonconductive heat conducting compound 114 that is configured to conduct heat away from heat generating component(s) 116. In addition, a shock absorbing material 128 is mechanically coupled, for example, flexibly coupled, to the electronic assembly and directly or indirectly to the casing. Shock absorbing material 128 is configured to prevent shearing of electronically nonconductive heat conducting compound 114.

Thus, in some embodiments of the x-ray imaging component, the x-ray electronic panel further includes a panel support 120 fixedly attached between circuit board 112 and panel 122. In some other embodiments, back cover 126 is rigidly mounted to circuit board 112 and shock absorbing material 128 is sandwiched between back cover 126 and cover wall 108.

In still other embodiments of the x-ray imaging component, back cover 126 is rigidly mounted to the electronic assembly and back cover 126 is cantilevered over a portion of cover wall 108 with shock absorbing material 128 therebetween. Shock absorbing material 128 is configured to absorb shock in both the x and y directions.

In yet other embodiments of the x-ray imaging component, back cover 126 is flush with a portion of cover wall 108 and shock absorbing material 128 comprises a shear shock absorbing material mechanically coupled between cover wall 108 and a cantilevered portion 150 of back cover 126 to provide shock absorption in both the x direction and the y direction. The x-ray imaging component further includes a one dimensional shock mount (130, 132, and 136 in FIG. 9) mechanically coupling back cover 126 to circuit board 112 and providing shock absorption in the z-direction.

Some embodiments of the present invention provide a method for mechanically isolating an electrical assembly (at least circuit board 112 and panel 122) from shock and for providing heat conduction out of the electrical assembly. These embodiments include thermally coupling heat from heat generating components 116 mounted on the electrical assembly to a back cover 126 of a casing using a thermal interface material (i.e., heat conducting compound 114, also including any variety of thermal gap pads). An x direction and a y direction are defined essentially parallel to a cover front 110 of the casing and perpendicular to each other, and a z direction is defined essentially perpendicular to cover front 110 and both the x direction and the y direction. The method further includes mechanically coupling back cover 126 to a cover wall 108 of the casing using a shock absorbing material 128 configured to absorb shock in at least both the x direction and the y direction.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An apparatus comprising:
   an electronic assembly including a panel and a circuit board;
   a casing surrounding the electronic assembly;
   at least one isolated member coupled to the casing; and
   a shock absorbing material flexibly coupling the electronic assembly directly or indirectly to the at least one isolated member and configured to absorb shock in multiple directions along a surface of the casing.

2. The apparatus of claim 1 wherein the apparatus is a radiographic imaging apparatus.

3. The apparatus of claim 1 wherein the panel is a radiographic imaging detector.

4. The apparatus of claim 3 wherein the radiographic imaging detector comprises an array of photoelectric conversion elements deposited on a substrate and coated with a scintillator.

5. The apparatus of claim 1 wherein the electronic assembly further comprises a panel support positioned between the circuit board and the panel.

6. The apparatus of claim 1 wherein the at least one isolated member is rigidly coupled to the circuit board and the shock absorbing material is sandwiched between the at least one isolated member and the casing.

7. The apparatus of claim 1 further comprising a heat conducting material coupling the circuit board to the at least one isolated member, the heat conducting material configured to conduct heat away from the circuit board to the at least one isolated member.

8. The apparatus of claim 7 wherein the heat conducting material and the shock absorbing material are the same, and comprise a heat conductive foam.

9. The apparatus of claim 8 further comprising flexible mounts directly or indirectly coupling said the circuit board to the at least one isolated member.

10. An x-ray imaging component comprising:
an electronic assembly including a circuit board, and an x-ray imaging panel;
a casing surrounding the electronic assembly;
at least one isolated member flexibly coupled to the casing;
a heat conducting material coupled between the circuit board and the at least one isolated member and configured to conduct heat away from the circuit board to the at least one isolated member; and
a shock absorbing material coupling the electronic assembly to the casing, and configured to absorb a shearing force applied to the heat conducting material.

11. The x-ray imaging component of claim 10 wherein the electronic assembly further comprises a panel support fixedly attached between the circuit board and the x-ray imaging panel.

12. The x-ray imaging component of claim 10 wherein the at least one isolated member is rigidly mounted to the circuit board and the shock absorbing material is sandwiched between the at least one isolated member and the casing.

13. The x-ray imaging component of claim 10 wherein the at least one isolated member is rigidly mounted to the electronic assembly.

14. A method for mechanically isolating an electrical assembly from shock and for providing heat conduction out of the electrical assembly, said method comprising:
thermally coupling heat from heat generating components mounted on the electrical assembly to a back cover of a casing using a thermal interface material, wherein an x direction and a y direction are defined essentially parallel to a cover front of the casing and perpendicular to each other, and a z direction is defined essentially perpendicular to the cover front and both the x direction and the y direction; and
mechanically coupling the back cover to a cover wall of the casing using a shock absorbing material configured to absorb shock in at least both the x direction and the y direction.

15. A radiographic apparatus comprising:
an external casing;
at least one isolated member flexibly coupled to the external casing with a shock absorbing material configured to absorb shock in multiple directions parallel to a front surface of the external casing; and
an internal imaging panel assembly attached to the at least one isolated member.

16. The radiographic apparatus of claim 15, wherein the internal imaging panel assembly detects radiation transmitted through an object and forms an image thereof.

17. The radiographic apparatus of claim 15, wherein the at least one isolated member is flexibly coupled to the external casing by one of a shock absorbing material, a shock isolating material or a flexible material.

18. The radiographic apparatus of claim 17, wherein the at least one of the shock absorbing material, shock isolating material or flexible material is situated between the external casing and the at least one isolated member.

19. The radiographic apparatus of claim 17, wherein the at least one of the shock absorbing material, shock isolating material or flexible material is situated between the external casing and the at least one isolated member, and
wherein the internal panel assembly is rigidly mounted to the at least one isolated member.

20. The radiographic apparatus of claim 15, wherein the internal imaging panel assembly is enclosed within the external casing and the at least one isolated member.

21. A radiographic apparatus comprising:
an external casing;
an internal panel assembly flexibly attached to the external casing; and
at least one conductive flexible member positioned between one side of the internal panel assembly and an internal surface of the external casing, wherein the conductive flexible member comprises both a heat conducting material and a shock absorbing material, the heat conducting material coupling the internal panel assembly to the internal surface of the external casing and configured to conduct heat away from the circuit board to the external casing and the shock absorbing material configured to absorb shock.

22. The radiographic apparatus of claim 21, wherein the internal panel assembly includes an imaging panel and at least one circuit board coupled thereto.

23. The radiographic apparatus of claim 22, wherein the at least one conductive flexible member is positioned between the circuit board and an inner surface of the external casing.

24. The radiographic apparatus of claim 21, wherein the internal panel assembly is flexibly mounted to the external casing with at least one flexible member.

25. The radiographic apparatus of claim 21, wherein the internal panel assembly includes an imaging panel, a panel support and at least one circuit board.

26. The radiographic apparatus of claim 21, wherein the at least one conductive flexible member is a conductive foam.

\* \* \* \* \*